United States Patent
Lord

(10) Patent No.: US 7,717,253 B2
(45) Date of Patent: May 18, 2010

(54) ARRANGEMENT FOR PROCESSING DISKS OF DIFFERENT SIZES

(75) Inventor: James W. Lord, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/926,091

(22) Filed: Aug. 26, 2004

(65) Prior Publication Data

US 2005/0060823 A1  Mar. 24, 2005

Related U.S. Application Data

(60) Provisional application No. 60/499,167, filed on Aug. 28, 2003.

(51) Int. Cl.
*B65G 17/34* (2006.01)
(52) U.S. Cl. .................. 198/803.11; 198/867.15; 198/734; 15/77
(58) Field of Classification Search .................. 198/731, 198/733, 734, 867.01, 867.08, 867.14, 867.15, 198/803.11; 15/77
See application file for complete search history.

(56) References Cited

U.S. PATENT DOCUMENTS

| 4,388,990 | A | * | 6/1983 | Michalik | 198/867.15 |
|---|---|---|---|---|---|
| 4,501,351 | A | * | 2/1985 | Tracy | 198/867.15 |
| 4,930,620 | A | * | 6/1990 | Springman | 198/867.15 |
| 5,586,642 | A | * | 12/1996 | Hawkins | 198/803.11 |
| 6,321,904 | B1 | * | 11/2001 | Mitchell | 198/867.11 |
| 6,525,835 | B1 | | 2/2003 | Gulati | |
| 6,588,043 | B1 | * | 7/2003 | Frost et al. | 198/733 |
| 6,624,835 | B2 | | 9/2003 | Willig | |
| 6,625,835 | B1 | | 9/2003 | Frost et al. | |

* cited by examiner

*Primary Examiner*—James R Bidwell

(57) ABSTRACT

An arrangement for processing disks provides a continuous loop, such as a roller drive chain, to which a plurality of disk securing elements, such as chain fingers, are attached at varying distances from one another. The chain fingers have a center line on an outwardly extending portion that is non-perpendicular with respect to the plane of the roller drive chain when viewed in a top view.

25 Claims, 4 Drawing Sheets

ARRANGEMENT FOR PROCESSING DISKS OF DIFFERENT SIZES

RELATED APPLICATIONS

This application is related to U.S. provisional application Ser. No. 60/499,167, filed Aug. 28, 2003, the priority of which is claimed and the contents of which are hereby incorporated by reference in their entirety.

FIELD OF THE INVENTION

The present invention relates to the field of disk manufacture, and in particular, to the transporting of disks in a manufacturing environment.

BACKGROUND OF THE INVENTION

The computer, information, and entertainment industries produce and consume vast quantities of disk-shaped substrates, such as silicon wafers, and aluminum, plastic, glass, or other multi-layered disks. In the fabrication of semiconductors, silicon wafers are processed through multiple fabrication steps which can include repeated application and removal of various conductive, non-conductive and semiconductive materials before the resulting microcircuits are complete and separated into individual dies. Aluminum, glass, and other composites disks substrates are typically overcoated with magnetic, optical, or magneto-optical materials in the fabrication of each HDDs, CDs, DVDs, and other such products.

Substrates typically need to be buffed, polished, etched, cleaned, and otherwise prepared repeatedly during the fabrication process. This is true for both wafer and disk substrates. In the semiconductor manufacturing industry, for example, integrated circuit devices designed of more complex, and more precise multi-layered structures require highly clean and prepared surfaces. In the field of magnetic and optical media disks, ever-increasing density translates into exacting requirements for disk cleaning and preparation. Defects resulting from improper, incomplete, or insufficient substrate buffing, polishing, cleaning, or other preparation produces decreased yield and increased time and cost.

Disk cascade scrubber arrangements are known that seek to process a plurality of disks in a rapid and efficient manner. See, for example, the disk cascade scrubber described in U.S. Pat. No. 6,525,835. In such a system, a track is provided that is configured to support a disk in a vertical orientation between pairs of rollers, with a pair of guiding rollers provided to transition the disk into vertical orientation along the track between the pairs of rollers.

FIGS. 1a and 1b illustrate components of a substrate drive assembly 131 in accordance with a known design such as that shown in U.S. Pat. No. 6,625,835. FIG. 1a shows a side view of the substrate drive assembly 131 with representative large substrates 108 shown. For ease of illustration, the substrates 108 are depicted as disks.

The substrates 108 are positioned in a vertical orientation and supported at two points on the edge of the substrate 108 by guiding rollers 122. These guiding rollers 122 are suspended above the substrate drive assembly 131 by guiding roller arms 154 and connected by roller arm brackets to the roller drive chain 120. The roller drive chain 120 is configured as an endless chain. The roller drive chain 120 is connected by sprockets to parallel shafts 134 and 136, one of which drives the rotation of the roller drive chain 120. Roller drive chain 120 can be constructed of stainless steel, plastic, or other low particulate-generating materials. The roller drive chain 120 can also be configured as a belt drive and connected to the two parallel shafts 134 and 136 by pulleys.

The guiding rollers 122 can be free-wheeling. These guiding rollers 122 are in contact with the substrate 108 edge and provide some lateral support. The guiding rollers 122 freely spin on the support arms 154 and offer no resistance to the rotation of the substrates 108. The roller drive chain 120 travels in the direction 123b which applies force to the substrates 108 through the guiding rollers 122 and cause the travel of the substrates 108 from one end to the other of the cascade scrubber assembly.

The substrates 108 are positioned on an edge rotational drive belt 124 or track configured to support the substrates 108 in the vertical orientation between the rollers. The edge rotational drive belt 124 is a track defining the path of the substrates 108 transitioning through the cascade scrubber assembly and can be an endless loop belt. The edge rotational drive belt 124 is connected to two parallel shafts 134 and 136, one of which drives the rotation of the edge rotational drive belt 124. The edge rotational drive belt 124 may travel in the direction 123a which is opposite the direction of travel 123b of the roller drive chain 120. The rotation of the edge rotational drive belt 134 applies a rotational force to the substrates 108 which are positioned between pairs of guiding rollers 122. Thus, as can be seen in FIG. 1a, the substrates 108, positioned on the edge rotational drive belt 124 which is rotating in direction 123a, will be caused to rotate in a clockwise direction in their position between pairs of free-wheeling guiding rollers 122. Roller drive chain 120, traveling in direction 123b, transitions the rotating substrates 108 from left to right as represented in FIG. 1a.

FIG. 1b shows the use of the system FIG. 1a with a smaller size substrate 108 than that shown in FIG. 1a. The substrates 108 in FIG. 1b are positioned on the edge rotational drive belt 124 between free-wheeling guiding rollers 122 suspended over edge rotational drive belt 124 and guiding roller arms 154. Because the substrates 108 in FIG. 1b are smaller than those shown in FIG. 1a, the spacing of the guiding rollers 122 is necessarily closer. The guiding roller arms 154 are configured such that the two most common substrate 108 sizes can be processed by the cascade scrubber system 100 without having to change or re-configure the substrate drive assembly 131 to accommodate the two differently sized substrates. As can be seen in FIGS. 1a and 1b, the substrates 108 are positioned between pairs of guiding rollers 122. The guiding roller arms 154 are configured to accept a larger substrate between a wide-spaced pair of guiding arms 121a and a smaller substrate between a narrowly-spaced pair of guiding arms 121b on the same roller drive chain 120. The size of the substrates 108 determines which pairs of guiding rollers 122 are selected to support the substrate 108.

In FIG. 1b, the height of the edge rotational drive belt 124 is adjustable. In processing the smaller sized substrates 108, the edge rotational drive belt 124 is raised to a position to maintain the diameter of the substrate 108 in the nip of the rollers 110. Because the guiding roller support arms 154 are configured to accept large or small substrates 108, as described above, no similar adjustment to the roller drive chain 120 is required.

There is an increasing need to be able to process wafers or substrates of many different sizes. Although U.S. Pat. No. 6,625,835 describes that the wafers or substrates could be of any size, this is difficult to achieve in practice with the arrangement depicted in FIGS. 1a and 1b. This is because the guiding roller arms 154 extend in a non-offset, vertical direction away from the roller drive chain 120. Hence, as depicted in FIGS. 1a and 1b, there are a limited number of positions at which the guiding roller arms 154 can be attached to the roller drive chain 120. The straight guiding roller arms 154 are thus positioned and attached to the roller drive chain 120 only at the pins connecting the links in the roller drive chain 120. There is therefore a lack of flexibility in the available positioning of the guiding roller arm 154, such that the distance between the guiding roller arms 154 is constrained to be some multiple of the distance between the pins of the links in the roller drive chain 120. Moreover, with the increasing number of different sized substrates or disks that need to be processed, greater flexibility is required to process these different sized substrates.

SUMMARY OF THE INVENTION

There is a need for an arrangement for processing disks or substrates which provides substantial flexibility in the size of the substrates being transported by a continuous loop.

These and other needs are met by embodiments the present invention which provide an arrangement from processing disks, comprising a continuous loop drivable in a first plane, and a plurality of disk securing elements, each having an attachment piece connecting the disk securing element to the loop. Each disk securing element has an upwardly extending portion connecting to the attachment piece and extending away from the loop in a second plane that is substantially parallel to the first plane. Each disk securing element has an outwardly extending portion connected to the upwardly extending portion and extending outwardly from the upwardly extending portion. The outwardly extending portion has a centerline that in a top view of the first plane is non-perpendicular with respect to the first plane. The plurality of disk securing elements are connected to the loop in a repeating pattern that includes the outwardly extending portion of a first one of the disk securing elements being separated from the outwardly extending portion of a second one of the disk securing elements by a first distance. The outwardly extending portion of the second one of the disk securing elements is separated from the outwardly extending portion of the third one of the disk securing elements by a second distance. The outwardly extending portion of the first one of the disk securing elements is separated from the outwardly extending portion of the third one of the disk securing elements by the sum of the first and second distances.

By having a disk securing element with an outwardly extending portion with a center line that from a top view at first plane is not perpendicular with respect to the plane of the continuous loop, allows disks of a great number of different sizes to be accommodated, in contrast to the relatively limited number of sizes provided by disk securing elements that are not offset.

The earlier stated needs are also met by other embodiments of the present invention which provide a disk washing tool comprising a drivable chain, and disk securing elements positioned on the chain to secure disks of different diameters therebetween. The disk securing elements, from a top view of the chain, extend away from the chain in a direction offset from a perpendicular direction with respect to the chain.

The earlier stated needs are met by still further embodiments of the present invention comprising a disk processing tool having a continuously drivable loop and means for securing disks of different diameters on the loop.

The foregoing and other features, aspects and advantages of the present invention will become more apparent from the following detailed description of the present invention taken in conjunction with the accompanied drawings.

DETAILED DESCRIPTION OF THE INVENTION

The present invention addresses and solves problems related to the transportation of disk-shaped objects by a continuous loop to which disk securing elements are attached. In particular, the invention solves, at least in part, problems presented by the use of disk securing elements that have hitherto been limited to providing a distance that is a multiple of the chain links in a roller drive chain, such as used, for example, in a disk scrubber tool. The invention achieves this, in part, by providing for disk securing elements for the rollers attached to the disk securing elements that are offset with respect to the drive chain. The offsetting of the rollers on the disk securing elements allows for easy varying of the size of the disks being transported by the arrangement and removes the limitation on the separation between the rollers carried by the disk securing elements of being a multiple of the chain links.

Figure 1A:
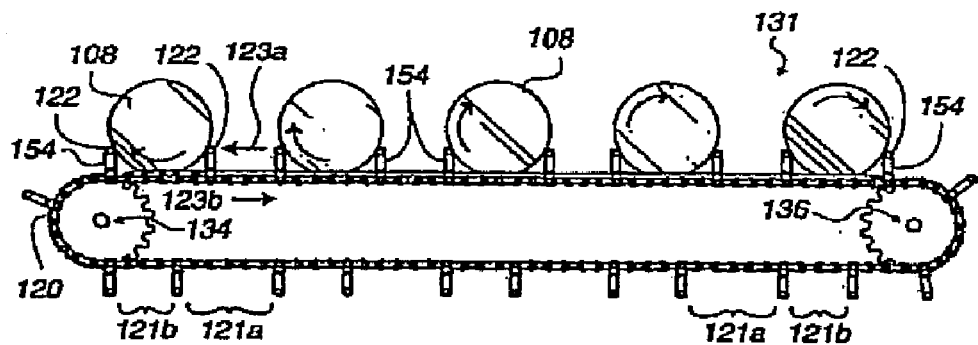
FIGS. 1a and 1b are schematic side views of a chain for a disk scrubber deployed in prior art disk scrubbing tools.
Figure 1B:
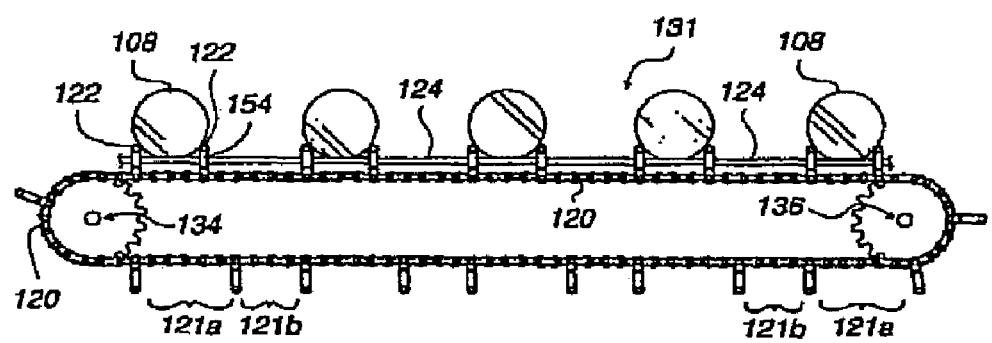
Figure 2:
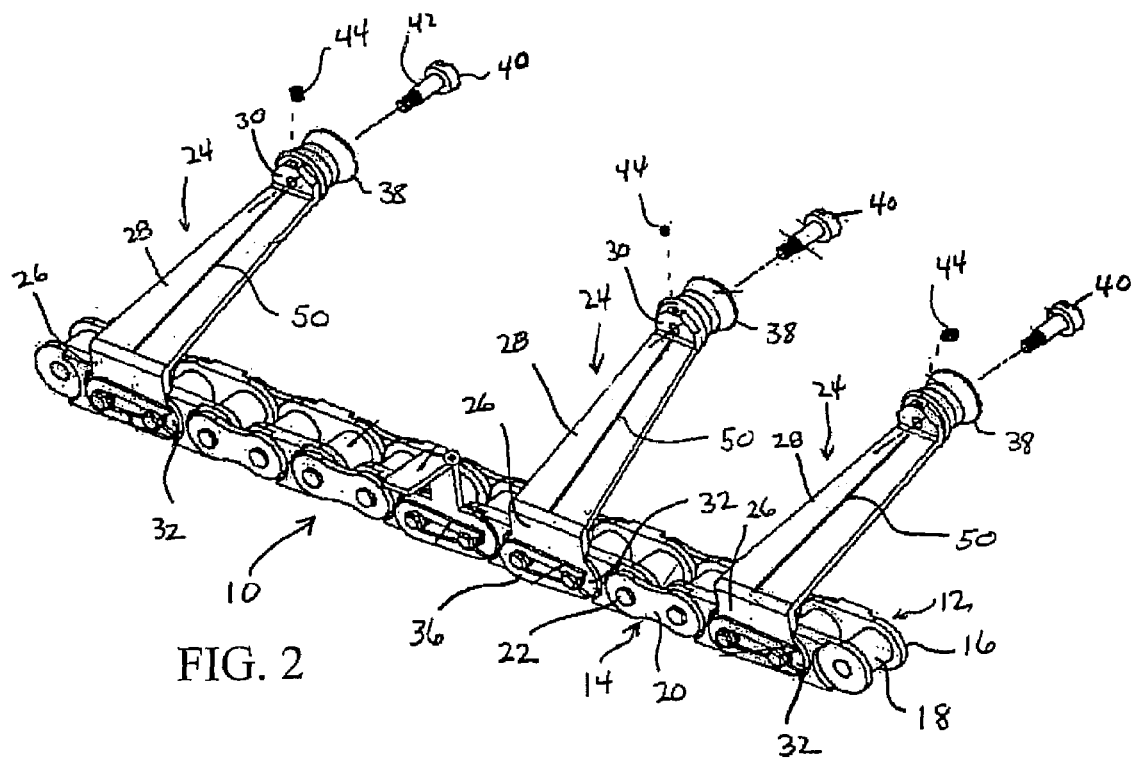
FIG. 2 is a perspective view of a portion of a roller drive chain and disk securing elements constructed in accordance with embodiments of the present invention.

FIG. 2 is a perspective view of a portion of a roller drive chain 10 constructed in accordance with an embodiment of the present invention for use in an arrangement for processing disks or other disk-shaped objects, such as wafers. This portion of the roller drive chain 10 is also depicted in side view in FIG. 3.

The roller drive chain 10 may be a conventional roller drive chain, and include roller links 12 and pin links 14. The roller links 12 include side plates 16 connecting a pair of rollers 18. The pin links 14 comprise side plates 20 and pins 22. The pins 22 extend through the rollers 18 to connect the ends of two roller links 12.

Figure 3:
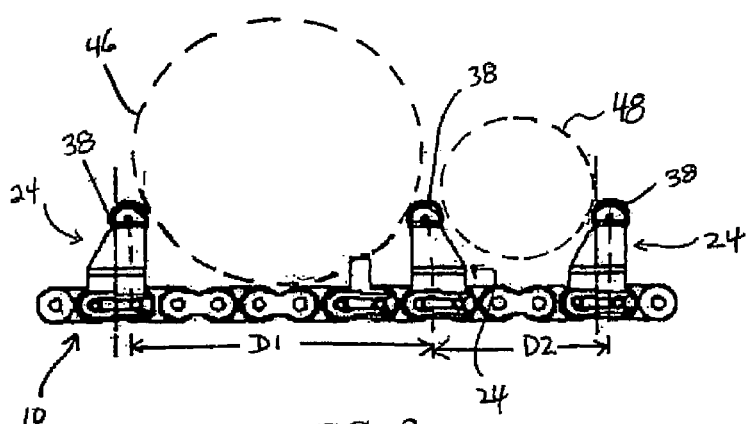
FIG. 3 is a side view of the portion of the roller drive chain of FIG. 2.

The portion of the roller drive chain 10 depicted in FIGS. 2 and 3 includes a plurality of disk securing elements 24. Each disk securing element 24 is attached to one of the side plates 20 of the pin link 14. The disk securing elements 24 are depicted in isolation in a perspective view in FIG. 6. The disk securing elements 24 may also be referred to as chain fingers. The disk securing elements 24 include an upwardly extending portion 26 and an outwardly extending portion 28. At one end of the outwardly extending portion 28 is a vertical portion 30.

Figure 6:
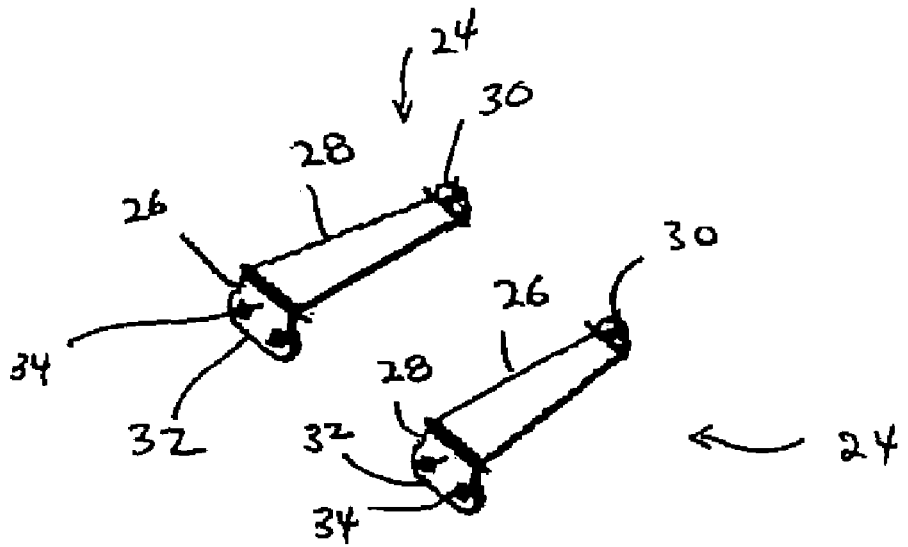
FIG. 6 is a perspective view of the disk securing elements of FIG. 4 in isolation.

The upwardly extending portion 26 has an attachment piece 32 having a pair of bores 34 (seen in FIG. 6). The disk securing element 24 may be formed as an integral piece, and may be made of stainless steel or other suitable material.

Each disk securing element 24 may be attached to the roller drive chain 10 by placement of the attachment piece 32 over the pins 22 of a pin link 14. This is followed by placement of a spring clip 36 over the pins 22 to firmly lock the disk securing element 24 in place.

Disk retaining elements 38 are attached to the disk securing elements 24 and serve to retain a disk or other disk-shaped workpiece between disk retaining elements 38 of adjacent disk securing elements 24. In the exemplarily embodiments, the disk retaining elements 38 are rollers and will be hereafter referred to as such, although other types of disk retaining elements may be employed without departing from the scope of the present invention. The rollers 38 are secured to the vertical portions 30 by fasteners 40 that extend through the rollers 38 and into the vertical portion 30. An exemplary embodiment of a fastener 40 is a screw with a shaft portion 42 that allows the rollers 38 to freely spin thereon. Set screws 44 may be inserted in the vertical portions 30 to secure the fasteners 40 within the vertical portions 30.

As can be seen in FIG. 3, which shows a single pattern that is repeated on the roller drive chain 10, the disk securing elements 24 within a pattern are separated from each other by varying distances. In the following description, the distances are measured from the center of the roller 38 to the center of the roller 38 of the next adjacent disk securing element 24. In FIG. 3, assuming that the left-most disk securing element 24 is the first one of the disk securing elements 24, the middle disk securing element 24 is the second one of the disk securing elements 24, and the right-most disk securing element 24 is the third one of the disk securing elements 24, the following relationships may be observed. The outwardly extending portion 28 (as measured at the roller 38) of the first one of the disk securing elements 24 is separated by a first distance from the outwardly extending portion 28 of the second one of the disk securing elements 24 by a first distance D1. The outwardly extending portion 28 of the second one of the disk securing elements 24 is separated from the outwardly extending portion 28 of the third one of the disk securing elements 24 by a second distance D2. Also, the outwardly extending portion of 28 of the first one of the disk securing elements 24 is separated from the outwardly extending portion 28 of the third one of the disk securing elements 24 by a distance that is equal to the sum of the first and second distances D1, D2. The different distances D1 and D2 separating adjacent outwardly extending portions 28 of the disk securing elements 24 accommodate different sized disks 46, 48, shown in phantom in FIG. 3.

Figure 9:
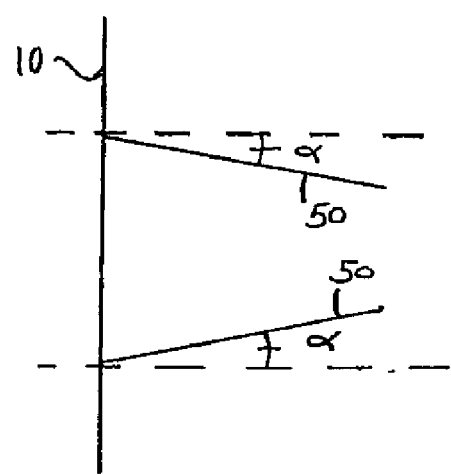
FIG. 9 is a top, schematic depiction of the roller drive chain and disk securing elements for illustrating the relationship of the offsetting of the disk securing elements with respect to the drive chain.

Although spacing disks securing elements different distances apart on the roller drive chain 10 will accommodate disks of different sizes, it does not itself provide for the flexibility to allow a great number of different size substrates to be accommodated and retained. This is because a prior art disk securing elements, such as those depicted in U.S. Pat. No. 6,624,835, do not have any offset, as described in the following, so that the distances between the disk securing elements are multiples of the pin links in the drive roller chain. To overcome this limitation, and allow for a greater number of substrates sizes to easily be accommodated and transported, the present invention provides disks securing elements having outwardly extending portions that are "offset". The outwardly extending portion 28 is shown as having a center line 50 in FIG. 2. As can thus be appreciated in the schematic depiction in FIG. 9 of a top view of the roller drive chain 10, the center lines 50 of each of the disk securing elements 24 extend at a non-perpendicular angle from the drive roller chain 10. The drive roller chain 10 can also be considered to form a first plane, the view of the drive roller chain in FIG. 9 depicting a cross section of that plane. The offset of the centerline 50 of the outwardly extending portion 28 can be at angle α that can be variously selected to precisely accommodate substrates or disks of different sizes. Hence, through the combination of varying the distances between adjacent drive securing elements 24, and the use of drive securing elements 24 with precisely selected offsets, a precise securing of numerous different sizes of substrates may be achieved.

Figure 4:
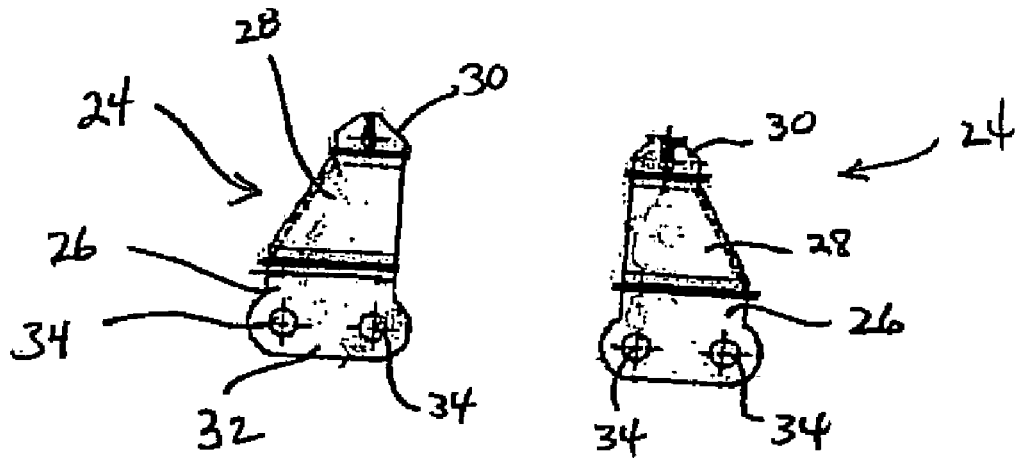
FIG. 4 is an end view of a mirror pair of disk securing elements constructed in accordance with embodiments of the present invention.

FIG. 4 depicts a pair of disk securing element 24, in end view. As can be seen, preferred embodiment of the disk securing elements 24 provides a mirror image pair of disk securing elements 24. Hence, the offset of the center line 50 is at opposite angles.

Figure 5:
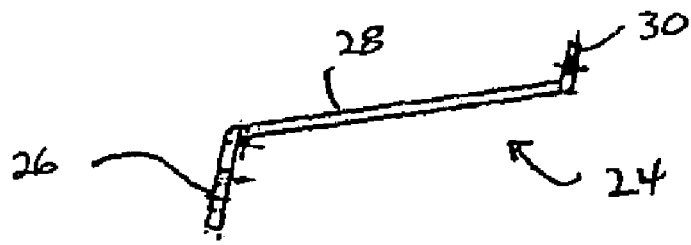
FIG. 5 is a side view of one of the disk securing elements of FIG. 4.

FIG. 5 depicts a disk securing element 24 in a side view. As can be readily appreciated from this view, the outwardly extending portion 28 does not form a perpendicular angle with respect to the outwardly extended portion 26 in this embodiment. However, in certain other embodiments, the outwardly extending portion 28 forms a 90° angle with respect to the upwardly extending portion 26.

Figure 7:
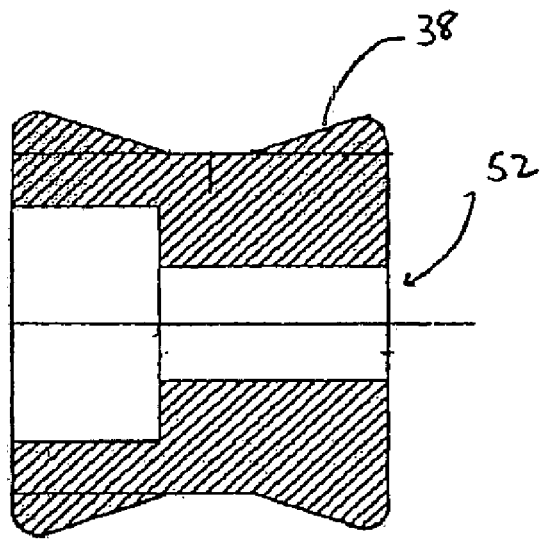
FIG. 7 depicts a cross-sectional view of a roller constructed in accordance with embodiments of the present invention.
Figure 8:
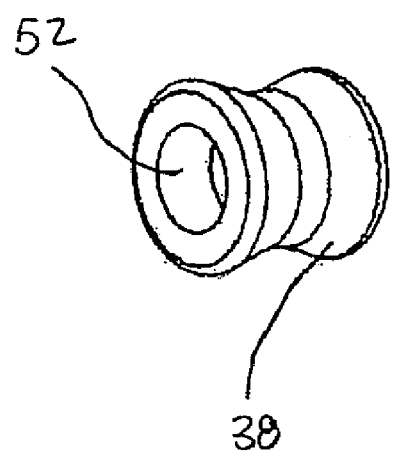
FIG. 8 is a perspective view the roller of FIG. 7 in isolation.

FIG. 8 is a perspective view of an exemplarily embodiment of a roller 38 that can be used as a disk retaining element in accordance with embodiments of the present invention. The roller 38 is depicted in cross-section in FIG. 7. A bore 52 is provided through which the fastener 40 is inserted to attach the roller 38 to the vertical portion 30 of the disk securing element 24. In certain embodiments of the invention, the roller 38 has a V-shaped groove to retain the disk, and in certain other embodiments, the roller 38 U-shaped groove to retain a disk.

The present invention provides a special utility in use with a disk scrubber, glory to transport disks within the scrubber. Scrubber acts as a dishwasher tool to wash disks during the or between various stages of a disk preparation and manufacturer in process.

The present invention provides a disk processing tool with a continuously drivable loop, such as a roller drive chain 10. Means for securing disks of different diameters on the loop are provided. The means can include a plurality of chain fingers such as provided by the disk securing elements 24 with offsets, attached to the loop at different distances from each other so as to accommodate different diameter disks between adjacent pairs of the chain fingers.

The present invention, a chain arrangement can be provided that accommodates disks of many different sizes, without the limitation provided by the use of chain fingers that do not have an offset. Furthermore, conventional roller drive chains may be retrofitted with the chain fingers of the present invention so that a rapid and cost effective method of accommodating disks of varying sizes is provided.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. An apparatus for processing disks, comprising:
   a continuous loop drivable in a first plane;
   plurality of disk securing elements each having an attachment piece connecting a respective disk securing element to the loop, each disk securing element comprising an upwardly extending portion connected to the attachment piece and extending away from the loop in a second plane that is substantially parallel to the first plane;
   each disk securing element comprising an outwardly extending portion connected to the upwardly extending portion and extending outwardly from the upwardly extending portion and having a centerline that in a top view of the first plane is non-perpendicular with respect to the first plane;

wherein the plurality of disk securing elements are connected to the loop in a repeating pattern that includes the outwardly extending portion of a first one of the disk securing elements being separated from the outwardly extending portion of a second one of the disk securing elements by a first distance, and the outwardly extending portion of the second one of the disk securing elements being separated from the outwardly extending portion of a third one of the disk securing elements by a second distance, the outwardly extending portion of the first one of the disk securing elements being separated from the outwardly extending portion of the third one of the disk securing elements by the sum of the first and second distances.

2. The apparatus of claim 1, wherein the pattern repeats on the loop such that the third one of the disk securing elements of each one of the patterns forms the first one of the disk securing elements of another one of the patterns.

3. The apparatus of claim 2, wherein the loop is a chain.

4. The apparatus of claim 3, wherein the disk securing elements are chain fingers.

5. The apparatus of claim 4, wherein the attachment piece, the upwardly extending portion and the outwardly extending portion of each disk securing element are integral.

6. The apparatus of claim 5, wherein each chain finger has a disk retaining element at an end of the outwardly extending portion, the disk retaining elements of adjacent ones of the chain fingers within each pattern configured to retain a disk therebetween.

7. The apparatus of claim 6, wherein each disk retaining element is a roller with a circumferential groove sized to accommodate an edge of a disk.

8. The apparatus of claim 7, wherein the groove has a V-shaped cross-section.

9. The apparatus of claim 7, wherein the groove has a U-shaped cross-section.

10. The apparatus of claim 7, wherein the arrangement is a disk scrubber, and the chain and the chain fingers are drivable to transport disks within the scrubber.

11. The apparatus of claim 10, wherein the first distance accommodates a disk of a first diameter held between the rollers of the chain fingers of the first and second disk securing elements, and the second distance accommodates a disk of a second diameter held between the rollers of the chain fingers of the second and third disk securing elements, the first and second diameters being different.

12. A disk washing tool comprising:
a drivable chain; and
disk securing elements positioned on the chain to secure disks of different diameters therebetween, the disk securing elements from a top view of the chain extending upwardly away from the chain in a direction offset from a perpendicular direction with respect to the chain, wherein the disk securing elements are separated from one another in a repeating pattern to provide disk diameter spaces, with at least some of the disk diameter spaces having different widths from each other to accommodate different disk diameters respectively, the disk securing elements being angled towards each other in side view of the chain in only certain width disk diameter spaces.

13. The tool of claim 12, wherein the disk securing elements are chain fingers configured to attach to the chain and has a portion that extends upwardly in the offset direction and a portion that extends outwardly.

14. The tool of claim 13, wherein each chain finger has a disk retaining element configured to receive an edge of a disk.

15. The tool of claim 14, wherein each disk retaining element is a roller.

16. A disk washing tool comprising:
a drivable chain;
disk securing elements positioned on the chain to secure disks of different diameters therebetween, the disk securing elements from a top view of the chain extending upwardly away from the chain in a direction offset from a perpendicular direction with respect to the chain,
wherein the disk securing elements are chain fingers configured to attach to the chain and have a portion that extends upwardly in the offset direction and a portion that extends outwardly,
wherein each chain finger has a disk retaining element configured to receive an edge of a disk, and
wherein each disk retaining element is a roller,
wherein the plurality of disk securing elements are connected to the loop in a repeating pattern that includes the outwardly extending portion of a first one of the disk securing elements being separated from the outwardly extending portion of a second one of the disk securing elements by a first distance, and the outwardly extending portion of the second one of the disk securing elements being separated from the outwardly extending portion of a third one of the disk securing elements by a second distance, the outwardly extending portion of the first one of the disk securing elements being separated from the outwardly extending portion of the third one of the disk securing elements by the sum of the first and second distances.

17. The tool of claim 16, wherein the roller has a circumferential groove with a U-shaped cross-section.

18. The tool of claim 16, wherein the roller has a circumferential groove with a V-shaped cross-section.

19. A disk processing tool, comprising:
a continuously drivable loop; and
means for securing disks of different diameters on the loop, wherein the means for securing disks are disk securing elements that are separated from one another in a repeating pattern to provide disk diameter spaces, with at least some of the disk diameter spaces having different widths from each other to accommodate different disk diameters respectively, the disk securing elements being angled towards each other in side view of the loop in only certain width disk diameter spaces.

20. The tool of claim 19, wherein the tool is a disk scrubber, and the means for securing include a plurality of chain fingers attached to the loop at different distances from each other so as to accommodate different diameter disks between adjacent pairs of the chain fingers.

21. A disk working tool comprising:
a drivable chain; and
disk securing elements positioned on the chain to secure disks of different diameters therebetween, the disk securing elements from a top view of the chain extending upwardly and outwardly away from the chain in a direction offset from a perpendicular direction with respect to the chain, the disk securing elements being separated from one another in a repeating pattern to provide disk diameter spaces of varying widths, wherein a different offset provides a different disk diameter space.

22. The tool of claim 21, wherein the disk securing elements are chain fingers configured to attach to the chain and has a portion that extends upwardly and a portion that extends outwardly.

23. The tool of claim 22, wherein each chain finger has a dish retaining element configured to receive an edge of a disk.

24. The tool of claim 23, wherein each disk retaining element is a roller.

25. A disk processing tool comprising:
   a continuously drivable loop; and
   means for securing disks of different diameters on the loop including disk securing elements forming different width disk diameter spaces, wherein said means for securing disks from a top view of the continuously drivable loop extends upwardly and outwardly away from the continuously drivable loop in a direction offset from a perpendicular direction with respect to the continuously drivable loop, wherein a different offset provides a different width disk diameter space.

* * * * *